United States Patent
Kim

(10) Patent No.: US 8,116,148 B2
(45) Date of Patent: *Feb. 14, 2012

(54) LOW POWER SHIFT REGISTER AND SEMICONDUCTOR MEMORY DEVICE INCLUDING THE SAME

(75) Inventor: Seung-Lo Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/940,860

(22) Filed: Nov. 5, 2010

(65) Prior Publication Data

US 2011/0058429 A1    Mar. 10, 2011

Related U.S. Application Data

(63) Continuation of application No. 12/164,184, filed on Jun. 30, 2008, now Pat. No. 7,852,687.

(30) Foreign Application Priority Data

Apr. 11, 2008    (KR) .......................... 10-2008-0033674

(51) Int. Cl.
  *G11C 7/12*   (2006.01)
  *G11C 19/00*   (2006.01)
(52) U.S. Cl. ................. 365/189.12; 365/189.05; 377/75
(58) Field of Classification Search .................. None
  See application file for complete search history.

(56) References Cited

U.S. PATENT DOCUMENTS 7,149,275 B1 * 12/2006 Hubbard ........................ 377/47
7,852,687 B2 * 12/2010 Kim ........................ 365/189.12

* cited by examiner

*Primary Examiner* — Hoai V Ho
*Assistant Examiner* — James G Norman
(74) *Attorney, Agent, or Firm* — IP & T Group LLP

(57) ABSTRACT

A shift register includes a shift circuit configured to shift an input signal in synchronization with a shift dock to output an output signal of the shift register, and a clock control circuit configured to enable the shift clock in response to the input signal and disable the shift clock in response to the output signal of the shift register.

20 Claims, 4 Drawing Sheets

LOW POWER SHIFT REGISTER AND SEMICONDUCTOR MEMORY DEVICE INCLUDING THE SAME

CROSS-REFERENCE TO RELATED APPLICATION

This application is a continuation of U.S. patent application Ser. No. 12/164,384 filed on Jun. 30, 2008 now U.S. Pat. No. 7,852,687, which claims priority of Korean patent application number 10-2008-0033674 filed on Apr. 11, 2008. The disclosure of each of the foregoing applications is incorporated herein reference in its entirety.

BACKGROUND OF THE INVENTION

The present invention relates to a shift register used in a variety of integrated circuits and the like, and more particularly, to a shift register consuming less current.

A shift register is a device for shifting an input signal in synchronization with a clock when transferring the input signal. The shift register is used in an integrated circuit, a semiconductor device and the like.

Hereinafter, the shift register used in a semiconductor memory device will be exemplarily described.

A semiconductor memory device satisfying DDR2/DDR3 specification secures a write recovery time (tWR) to ensure a complete data storage operation in a memory cell enabled by an active command. That is, a precharge operation of the cell is prohibited during the write recovery time (tWR).

In an auto precharge mode, even if a separate precharge command is not given, the precharge operation is performed at a timing defined in the specification if a column address <10> has a logic high level when a write or read command is applied. As a result of the precharge operation, an activated word line is deactivated and a bit line is precharged.

In the auto precharge mode, if a write with auto precharge command is applied, a start point of the precharge operation is determined by the write recovery time (tWR) based on the clock, which is set in a mode register set.

That is, the precharge operation is started internally after the write recovery time (tWR) from an input of the write with auto precharge command.

The shift register is used to allow the precharge operation to be performed after the write recovery time (tWR), which is based on the clock, from the input of the write command.

FIG. 1 is a circuit diagram of a conventional shift register used in a semiconductor memory device to secure a write recovery time (tWR).

Referring to FIG. 1, the conventional shift register includes a plurality of shift units 110, 120, 130, 140, 150 and 160. Each of the shift units 110 to 160 shifts an input signal by one clock pulse in synchronization with a clock CLOCK.

The input signal is a write with precharge signal INPUT that is activated when a write command is input when a column address <10> has a logic high level. The plurality of shift units 110 to 160 each shifts the write with precharge signal INPUT by one clock pulse in synchronization with the clock CLOCK.

One of output signals A, B, C, D, E and F of the plurality of shift units 110, 120, 130, 140, 150 and 160 is output as an auto precharge signal APCG. For example, when the write recovery time tWR is 3, the write with precharge signal INPUT is delayed by the three shift units 110, 120 and 130 before being output as the auto precharge signal APCG. When the write recovery time tWR is 6, the write with precharge signal INPUT is delayed by the six shift units 110, 120, 130, 140, 150 and 160 before being output as the auto precharge signal APCG. The write recovery time tWR is set at a value between 1 and 6 by signals TWR1, TWR2, TWR3, TWR4, TWR5 and TWR6 respectively.

That is, the shift register delays the write with precharge signal INPUT by the write recovery time tWR based on the clock CLOCK to output the auto precharge signal APCG.

FIG. 2 is a circuit diagram of the shift unit 110 in the conventional shift register of FIG. 1.

Referring to FIG. 2, the shift unit 110 includes two pass gates PG1 and PG2, and two latches 111 and 112. This is because the shift unit 110 is designed to shift the write with precharge signal INPUT by one clock pulse. In a case where the shift unit 110 is designed to shift the write with precharge signal INPUT by half a clock pulse, the shift unit 110 may include only one pass gate and one latch.

In operation, when the clock CLOCK has a logic low level, the first gate PG1 is turned on, and when the clock CLOCK has a logic high level, the second pass gate PG2 is turned on. Then, the write with precharge signal INPUT is sequentially shifted to the latch unit 111 and then to the next latch unit 112 every half clock pulse. Consequently, the shift unit 110 including the two pass gates PG1 and PG2 and the two latches 111 and 112 shifts the write with precharge signal INPUT by one clock pulse.

The shift unit 110 further includes a transistor 113 configured to reset the signal in the latch 111 in response to an initialization signal INITIAL.

FIG. 3 is a timing diagram illustrating an operation of the conventional shift register of FIG. 1.

For simplicity, FIG. 3 illustrates a case where the write recovery time tWR is 6. When the write with precharge signal INPUT is received, the shift register shifts the write with precharge signal INPUT by six clock pulses to output the auto precharge signal APCG. As such, the memory device can perform an auto precharge operation after the write recovery time tWR from a write operation.

As the operation speed of a memory device, semiconductor device or an integrated circuit including the shift register is increased, frequency of a clock for the shift register is also increased accordingly.

Then, the current consumption of the shift register is also increased accordingly. This is because the shift register is operated based on the clock, and thus the shift register consumes current every toggling of the clock. Therefore, there is a demand for a low power shift register consuming less current.

SUMMARY OF THE INVENTION

Embodiments of the present invention are directed to providing a low power shift register consuming less current and a semiconductor memory device including the low power shift register.

In accordance with an aspect of the invention, there is provided a shift register, comprising a shift circuit configured to shift an input signal in synchronization with a shift clock to output an output signal of the shift register, and a clock control circuit configured to enable the shift clock in response to the input signal and disable the shift clock in response to the output signal of the shift register.

As such, the shift register does not always toggle the shift clock, but instead, toggles the shift clock only while the input signal is shifted. Accordingly, it is possible to reduce current consumption of the shift register.

In accordance with another aspect of the invention, there is provided a semiconductor memory device, comprising, a shift circuit configured to shift a write with precharge signal in synchronization with a shift clock to output an auto precharge signal, and a clock control circuit configured to enable the shift clock in response to the write with precharge signal and disable the shift clock in response to the auto precharge signal.

As such, when the write with precharge signal is activated, the semiconductor memory device toggles the shift clock to shift the write with precharge signal. On the contrary, when the shifting is completed and thus the auto precharge signal is activated, the semiconductor memory device disables the shift clock, i.e., stops the toggling of the shift clock. Accordingly, it is possible to reduce current consumption of the semiconductor memory device.

DESCRIPTION OF SPECIFIC EMBODIMENTS

Hereinafter, a low power shift register and a semiconductor memory device including the low power shift register in accordance with the present invention will be described in detail with reference to the accompanying drawings.

Figure 4:
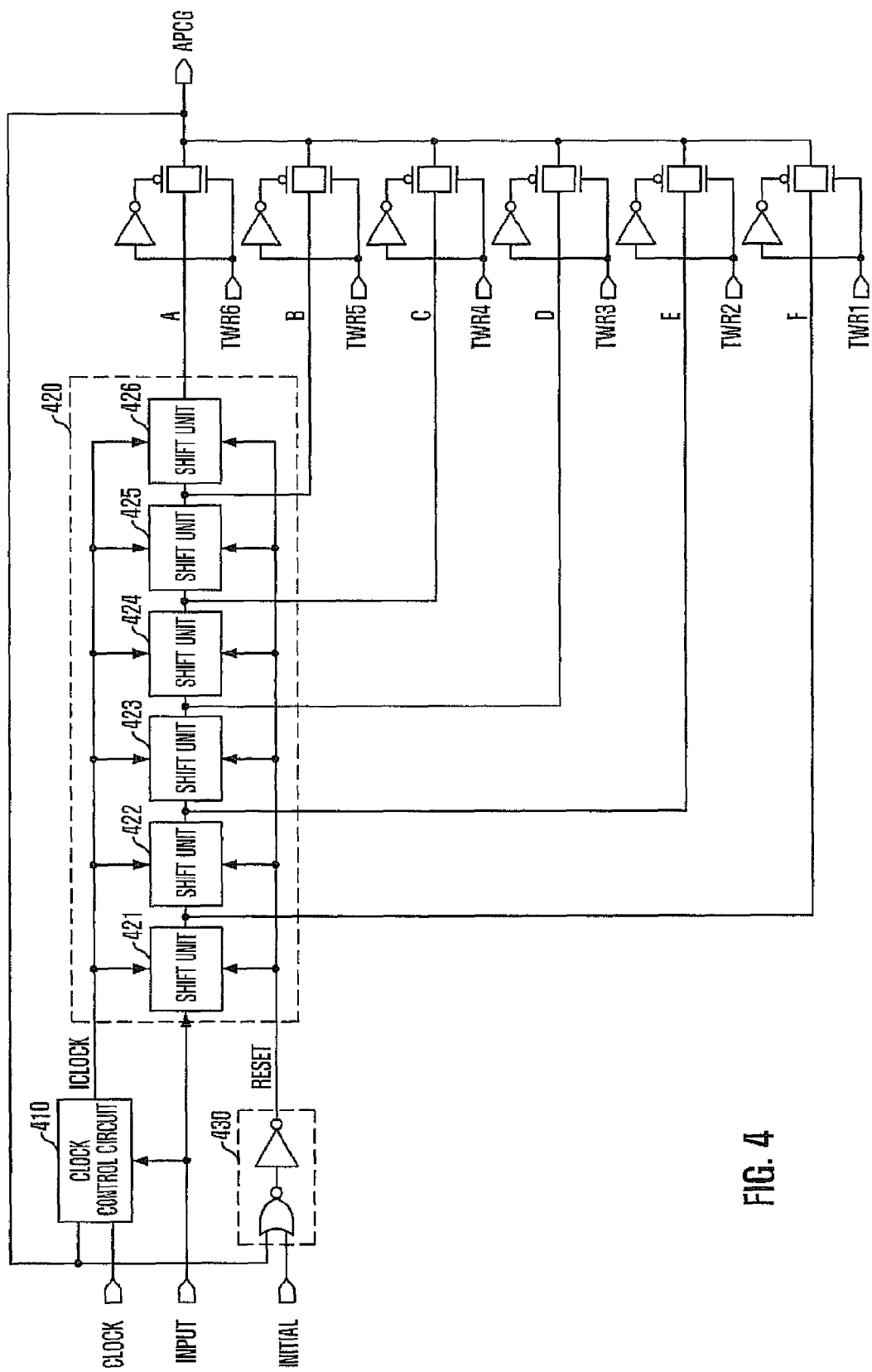
FIG. 4 is a circuit diagram of a shift register in a semiconductor memory device, in accordance with an embodiment of the present invention.

FIG. 4 is a circuit diagram of a shift register in a semiconductor memory device, in accordance with an embodiment of the invention.

Referring to FIG. 4, the shift register includes a clock control circuit 410 and a shift circuit 420. The clock control circuit 410 enables a shift clock ICLOCK in response to a write with precharge signal INPUT and disables the shift clock ICLOCK in response to an auto precharge signal APCG. The shift circuit 420 shifts the write with precharge signal INPUT in synchronization with the shift clock ICLOCK to generate the auto precharge signal APCG.

In more detail, the clock control circuit 410 enables the shift clock ICLOCK when the write with precharge signal INPUT is activated. The enabling of the shift clock ICLOCK refers to toggling the shift clock ICLOCK. Before the write with precharge signal INPUT is activated, there is no signal to shift, and thus there is no need to toggle the shift clock ICLOCK. The clock control circuit 410 disables the shift clock ICLOCK when the auto precharge signal APCG is activated. The disabling of the shift clock ICLOCK refers to stopping the toggling of the shift clock ICLOCK, i.e., fixing the logic level of the shift clock ICLOCK to a logic high level or a logic low level.

The shift clock ICLOCK is disabled when the auto precharge signal APCG is activated. However, it does not mean that the shift clock ICLOCK is disabled immediately when the auto precharge signal APCG is activated. This is because the auto precharge signal APCG needs a certain margin to be deactivated after being activated. Surely, in a case where the auto precharge signal APCG does not need to be deactivated after it is activated, the shift clock ICLOCK may be disabled immediately when the auto precharge signal APCG is activated. The clock control circuit 410 will be described in more detail later with reference to FIG. 5.

Figure 1:
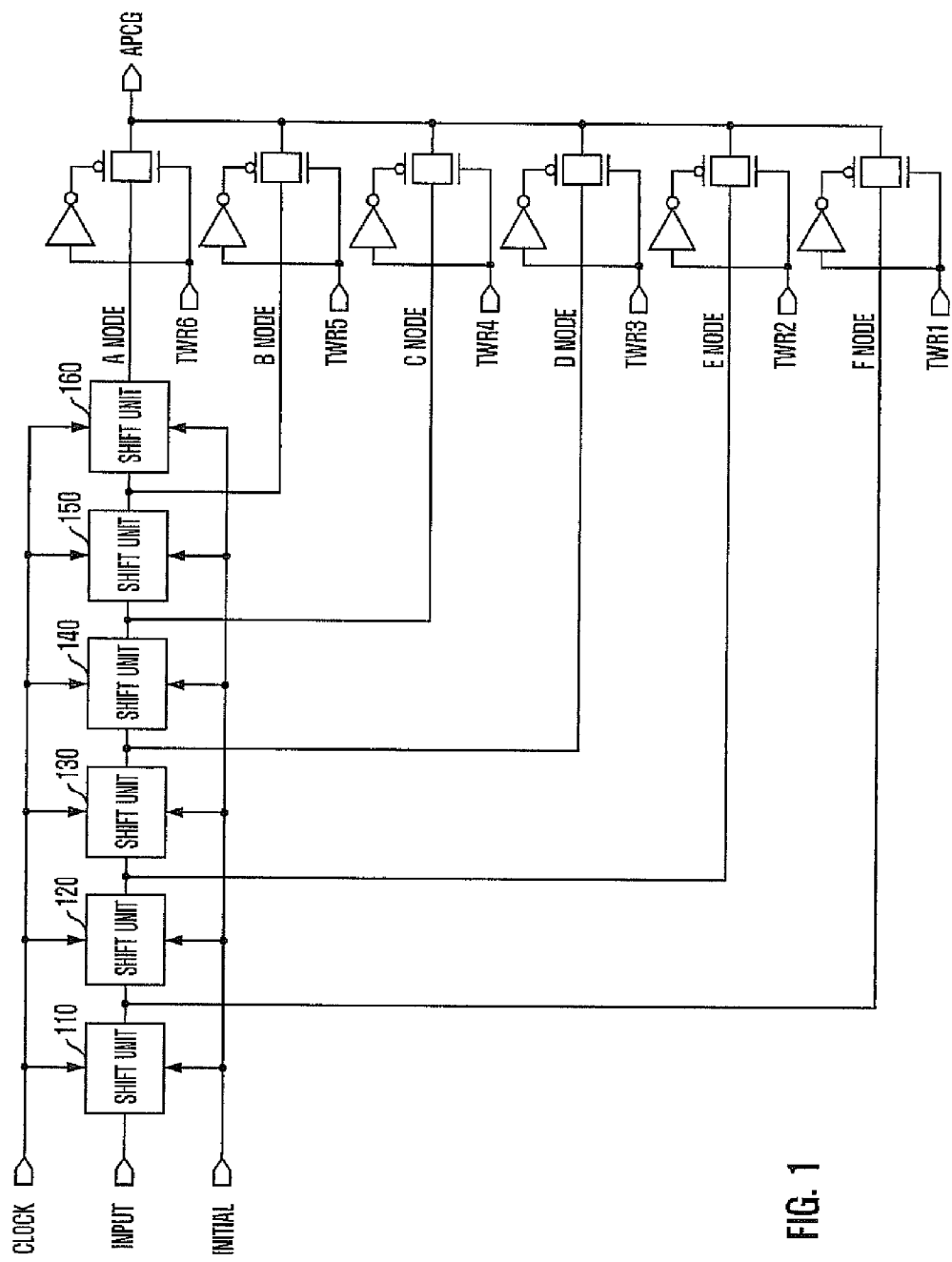
FIG. 1 is a circuit diagram of a conventional shift register used in a semiconductor memory device to secure a write recovery time.
Figure 2:
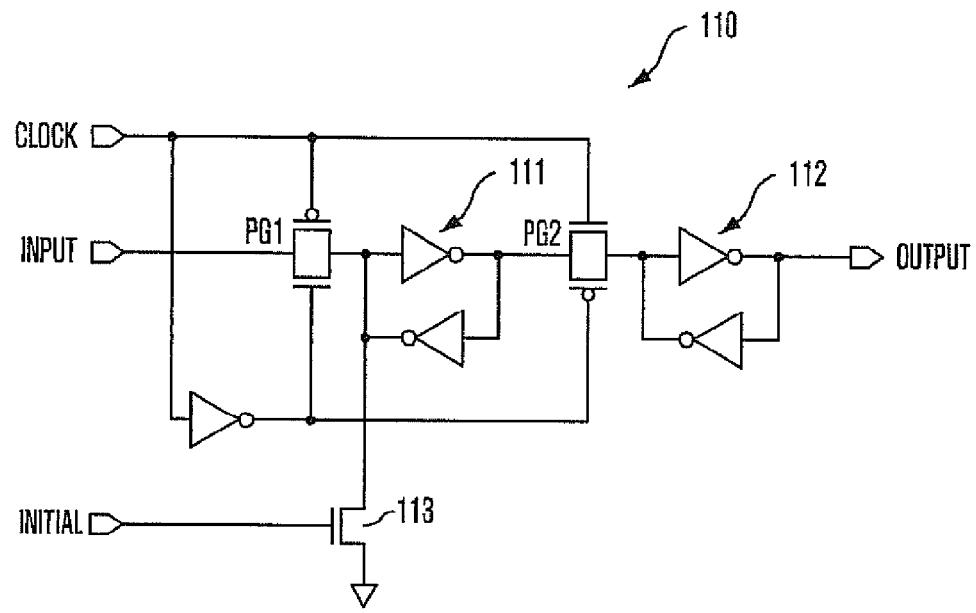
FIG. 2 is a circuit diagram of a shift unit in the conventional shift register of FIG. 1.
Figure 3:
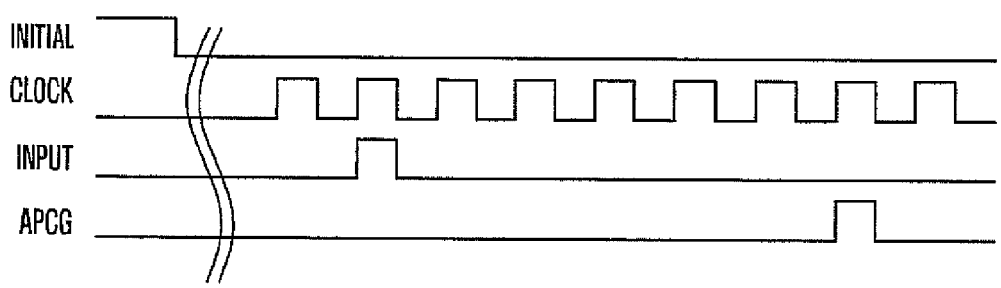
FIG. 3 is a timing diagram illustrating an operation of the conventional shift register of FIG. 1.

The shift circuit 420 shifts the write with precharge signal INPUT in synchronization with the shift clock ICLOCK. The shift circuit 420 includes a plurality of shift units 421 to 426. Each of the shift units 421 to 426 shifts a signal input thereto by one clock pulse. The shift time of each of the shift units 421 to 426 may be appropriately selected. For example, each of the shift units 421 to 426 may also be designed to shift the signal input thereto by half clock or by two clock pulses or longer. Each of the shift units may be the conventional shift unit of FIG. 2.

FIG. 4 illustrates a shift register used in a semiconductor memory device, which receives a write with auto precharge signal INPUT to generate an auto precharge signal APCG. The shift time applied to the write with auto precharge signal INPUT for outputting the auto precharge signal APCG is determined by the write recovery time tWR. Accordingly, the shift register of FIG. 4 outputs one of the output signals A, B, C, D, E and F of the respective shift units 421, 422, 423, 424, 425 and 426, which is selected according to the write recovery time tWR, as the auto precharge signal APCG.

In a case that the shift time (number of clock pulses) needs to be varied, the shift register may further include a selection circuit 430 configured to select one of the output signals A, B, C, D, E and F of the respective shift units 421, 422, 423, 424, 425 and 426 to output the selected output signal as the auto precharge signal APCG.

The selection circuit 430 is configured to perform an OR operation on an initialization signal INITIAL and the auto precharge signal APCG to generate a reset signal RESET. The reset signal RESET is used to reset the signal in each of the shift units 421 to 426. Therefore, whichever of the initialization signal INITIAL and the auto precharge signal APCG is activated, the reset signal RESET is activated to reset the signal in each of the shift units 421 to 426. That is, the shift circuit 420 is reset when the auto precharge signal APCG is activated because the activation of the auto precharge signal APCG indicates the termination of the operation of the shift circuit 420. The selection circuit 430 is optional, and it is also possible that each of the shift units 421 to 426 directly receives the initialization signal INITIAL.

Figure 5:
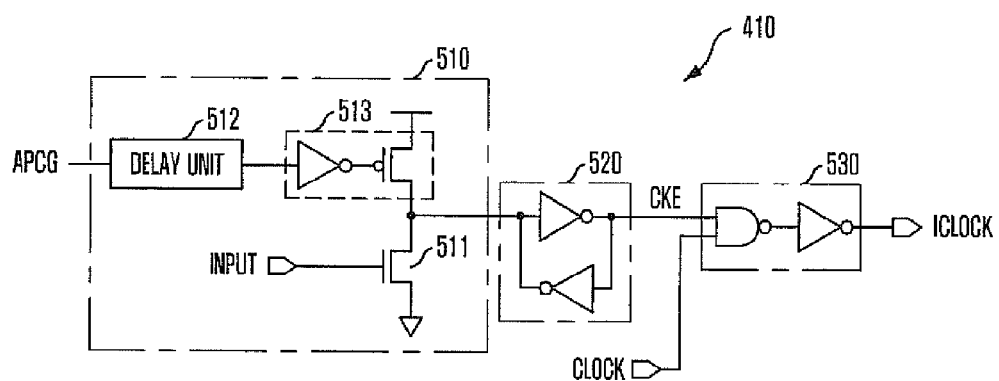
FIG. 5 is a circuit diagram of a clock control circuit of the shift register of FIG. 4.

FIG. 5 is a circuit diagram of a clock control unit of the shift register of FIG. 4.

The clock control circuit 410 includes a signal receiving unit 510, a latch unit 520 and a control unit 530. The signal receiving unit 510 activates a clock enable signal CKE in response to the write with precharge signal INPUT and deactivates the clock enable signal CKE in response to the auto precharge signal APCG. The latch unit 520 allows the clock enable signal CKE to be fixed at a constant logic level. The control unit 530 enables or disables the shift clock ICLOCK according to the clock enable signal CKE.

The signal receiving unit 510 includes an activation unit 511, a delay unit 512 and a deactivation unit 513. The activation unit 511 activates the clock enable signal CKE when the write with precharge signal INPUT is activated. The delay unit 512 delays the auto precharge signal APCG. The deactivation unit 513 deactivates the clock enable signal CKE when an output signal of the delay unit 512 is activated.

Referring to FIG. 5, the activation unit 511 may be configured with an NMOS transistor. The delay unit 512 may be configured with a typical delay unit or a shift unit, e.g., the shift unit 421 of FIG. 4, which delays a signal input thereto by one clock pulse. As described above, the delay unit 512 is configured to secure a margin, i.e., a time required to deactivate the auto precharge signal APCG after activating it. The delay time of the delay unit 512 may be appropriately selected. Typically, approximately one clock pulse is sufficient for the delay time. The deactivation unit 513 may be configured with an inverter for inverting an output signal of the delay unit 512, and a PMOS transistor receiving an output signal of the inverter at a gate.

The latch unit 520 may have a simple configuration of a pair of inverters. An output terminal of the one inverter is connected to an input terminal of the other inverter, and vice versa. The control unit 530 may be configured with an AND gate (or a NAND gate and an inverter) for receiving the clock CLOCK and the clock enable signal CKE to generate the shift clock ICLOCK.

In operation, when the write with precharge signal INPUT has a logic high level, the activation unit 511 is turned on. Then, the clock enable signal CKE is activated to a logic high level and latched in the latch unit 520. As the clock enable signal CKE is activated to a logic high level, the control unit 530 transfers the clock CLOCK directly as the shift clock ICLOCK. That is, the shift clock ICLOCK toggles so that the shift circuit 420 performs shift operations.

When the auto precharge signal is activated to a logic high level, the deactivation unit 513 is turned on after a certain margin which is determined by the delay unit 512. Then, the clock enable signal CKE is deactivated to a logic low level and latched in the latch unit 520. As the clock enable signal CKE is deactivated to a logic low level, the control unit 530 fixes the shift clock ICLOCK to a logic low level regardless of the toggling of the clock CLOCK. That is, the shift clock ICLOCK stops the toggling so that the shift circuit 420 does not perform the shift operation and thus does not consume current.

Figure 6:
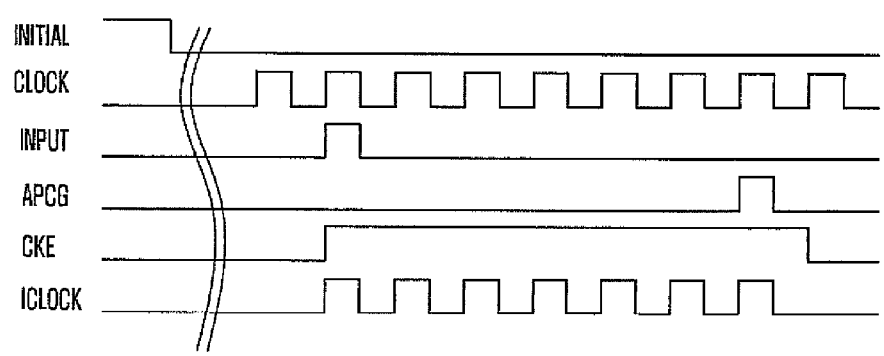
FIG. 6 is a timing diagram illustrating an overall operation of the shift register of FIG. 4.

FIG. 6 is a timing diagram illustrating an overall operation of the shift register of FIG. 4.

For simplicity, FIG. 6 illustrates the case where the write recovery time tWR is 6, i.e., where an output signal of the shift unit 426 is selected as the auto precharge signal APCG.

When the write with precharge signal INPUT is activated, the shift clock ICLOCK immediately starts toggling. Then, the write with precharge signal INPUT is shifted by six clock pulses by the shift circuit 420 to activate the auto precharge signal APCG. After a certain margin from the activation of the auto precharge signal APCG, the shift clock ICLOCK stops toggling.

As a result, the shift clock ICLOCK toggles only while the write with precharge signal INPUT is shifted and output as the auto precharge signal APCG. Accordingly, at other times, the shift clock ICLOCK does not toggle, and thus unnecessary current is not consumed.

As described above, the shift register in accordance with the embodiments of the invention enables the shift clock only while the input signal is actually shifted. As such, an unnecessary toggling of the shift clock can be prevented, and thus the current consumption due to the toggling of the shift clock can be reduced.

While the invention has been described with respect to the specific embodiments, it will be apparent to those skilled in the art that various changes and modifications may be made without departing from the spirit and scope of the invention as defined in the following claims.

Particularly, although the shift register used in the semiconductor memory device is described above, the invention is not limited thereto. That is, the shift register in accordance with the invention may also be applied to any integrated circuit, semiconductor memory device and the like that need to delay an input signal based on a clock.

What is claimed is:

1. A shift register, comprising:
    a shift circuit comprising a plurality of shift units, each shift unit shifting an input signal by one clock pulse in synchronization with a shift clock to output a plurality of output signals;
    a selection circuit configured to output a shift signal as an output signal of the shift register by selecting one of the output signals of the shift units in response to a selection signal; and
    a clock control circuit configured to enable the shift clock in response to the input signal and disable the shift clock in response to the shift signal.

2. The shift register of claim 1, wherein the clock control circuit is configured to disable the shift clock after a predetermined time from an activation of the shift signal.

3. The shift register of claim 1, wherein the clock control circuit includes:
    a signal receiving unit configured to activate a clock enable signal in response to the input signal and deactivate the clock enable signal in response to the shift signal;
    a latch unit configured to maintain a logic level of the clock enable signal; and
    a control unit configured to enable or disable the shift clock according to the clock enable signal.

4. The shift register of claim 3, wherein the signal receiving unit includes:
    an activation unit configured to activate the clock enable signal when the input signal is activated;
    a delay unit configured to delay the shift signal by a predetermined time; and
    a deactivation unit configured to deactivate the clock enable signal when an output signal of the delay unit is activated.

5. The shift register of claim 3, wherein the control unit outputs a toggling clock as the shift clock when the clock enable signal is activated, and fixes the shift clock to a predetermined logic level when the clock enable signal is deactivated.

6. The shift register of claim 1, further comprising:
    an initialization circuit configured to output a reset signal, which is used to reset the shift units, in response to an initialization signal and the shift signal.

7. The shift register of claim 6, wherein the initialization circuit performs an OR operation on the initialization signal and the shift signal to generate the reset signal.

8. A semiconductor memory device, comprising:
    a shift circuit configured to comprise a plurality of shift unit, each shift unit shifting a write with precharge signal by one clock pulse in synchronization with a shift clock to output a plurality of output signals;
    a selection circuit configured to output an auto precharge signal by selecting one of the output signals of the shift units corresponding to a write recovery time; and
    a clock control circuit configured to enable the shift clock in response to the write with precharge signal and disable the shift clock in response to the auto precharge signal.

9. The semiconductor memory device of claim 8, wherein the clock control circuit is configured to disable the shift clock from a predetermined time from an activation of the auto precharge signal.

10. The semiconductor memory device of claim 8, wherein the clock control circuit includes:

a signal receiving unit configured to activate a clock enable signal in response to the write with precharge signal and deactivate the clock enable signal in response to the auto precharge signals;

a latch unit configured to maintain a logic level of the clock enable signal; and a control unit configured to enable or disable the shift clock according to the clock enable signal.

11. The semiconductor memory device of claim 10, wherein the signal receiving unit includes:

an activation unit configured to activate the clock enable signal when the write with precharge signal is activated;

a delay unit configured to delay the auto precharge signal by a predetermined delay time; and a deactivation unit configured to deactivate the clock enable signal when an output signal of the delay unit is activated.

12. The semiconductor memory device of claim 10, wherein the control unit outputs a toggling clock as the shift clock when the clock enable signal is activated, and fixes the shift clock to a predetermined logic level when the clock enable signal is deactivated.

13. The semiconductor memory device of claim 8, further comprising:

an initialization circuit configured to output a reset signal, which is used to reset the shift units, in response to an initialization signal and the auto precharge signal.

14. The semiconductor memory device of claim 13, wherein the initialization circuit performs an OR operation on the initialization signal and the auto precharge signal to generate the reset signal.

15. The semiconductor memory device of claim 8 wherein the write recovery time is set by a mode register setting.

16. The semiconductor memory device of claim 8, the selection circuit comprises a plurality of transfer gate, each corresponding to a respective one of the shift units and being turned on corresponding to the write recovery time.

17. A method for driving a semiconductor memory device, comprising:

shifting a write with precharge signal by one clock pulse at least once in synchronization with a shift clock to output a plurality of output signals;

outputting an auto precharge signal by selecting one of the output signals in response to a write recovery time; and controlling the shift clock by enabling the shift clock in response to the write with precharge signal and disabling the shift clock in response to the auto precharge signal.

18. The method of claim 17, wherein the disabling of the shift clock is performed after a predetermined time from an activation of the auto precharge signal.

19. The method of claim 17, wherein the controlling of the shift clock includes:

activating a clock enable signal in response to the write with precharge signal and deactivating the clock enable signal in response to the auto precharge signal;

maintaining a logic level of the clock enable signal; and enabling or disabling the shift clock according to the clock enable signal.

20. The method of claim 17, further comprising:

initializing the shifting of the write with precharge signal in response to an initialization signal and the auto precharge signal.

* * * * *